US 6,542,420 B2

(12) United States Patent
Takase

(10) Patent No.: US 6,542,420 B2
(45) Date of Patent: Apr. 1, 2003

(54) SEMICONDUCTOR DEVICE WITH FLEXIBLE REDUNDANCY SYSTEM

(75) Inventor: Satoru Takase, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/953,307

(22) Filed: Sep. 17, 2001

(65) Prior Publication Data

US 2002/0031021 A1 Mar. 14, 2002

Related U.S. Application Data

(63) Continuation of application No. 09/739,240, filed on Dec. 19, 2000, which is a continuation of application No. 09/296,269, filed on Apr. 22, 1999, now Pat. No. 6,188,618.

(30) Foreign Application Priority Data

Apr. 23, 1998 (JP) ............................................. 10-112967
Apr. 15, 1999 (JP) ............................................. 11-108096

(51) Int. Cl.[7] ................................................. G11C 7/00
(52) U.S. Cl. ................................... 365/200; 365/230.03
(58) Field of Search ............................. 365/200, 230.03

(56) References Cited

U.S. PATENT DOCUMENTS

| 5,430,679 A | 7/1995 | Hiltebeitel et al. ......... 365/200 |
| 5,487,039 A | 1/1996 | Sukegawa ................... 365/200 |
| 5,502,676 A | 3/1996 | Pelley, III et al. .......... 365/200 |
| 5,684,746 A | 11/1997 | Oowaki et al. ............. 365/200 |
| 5,703,817 A | 12/1997 | Shiratake et al. ........... 365/200 |
| 6,188,618 B1 * | 2/2001 | Takase ....................... 365/200 |
| 6,314,032 B2 * | 11/2001 | Takase ....................... 365/200 |
| 6,438,045 B1 * | 8/2002 | King et al. .................. 365/200 |

FOREIGN PATENT DOCUMENTS

| JP | 0053299 | * 2/1990 | ........... G11C/17/00 |
| JP | 4-102295 A | 4/1992 | |

OTHER PUBLICATIONS

Betty Prince, "Semiconductor Memories", 1983, Wiley, $2^{nd}$ edition pp. 762–764.*
Masahi Horiguchi et al., "A Flexible Redundancy Technique for High–Density DRAM's," Jan. 1991, IEEE Journal of Solid–State Circuits, vol. 26, No. 1, pp. 12–17.
Toshiaki Kirihata et al., "Fault–Tolerant Designs for 256 Mb DRAM," Apr. 1996, IEEE Journal of Solid–State Circuits, vol. 31, No. 4, pp. 558–566.
Betty Prince, "Semiconductor Memories," 1983, Wisley, $2^{nd}$ Ed., pp. 761–762.

* cited by examiner

Primary Examiner—M. Tran
(74) Attorney, Agent, or Firm—Banner & Witcoff, Ltd.

(57) ABSTRACT

A memory cell array includes spare elements for saving a defective cell. Fuse sets each contain a defective address and mapping information indicative of the relationship between the fuse sets and the spare elements. When the defective address matches an input address, each fuse set outputs a signal for activating a corresponding spare element. The number of the fuse sets within a chip is smaller than the number of the spare elements.

33 Claims, 8 Drawing Sheets

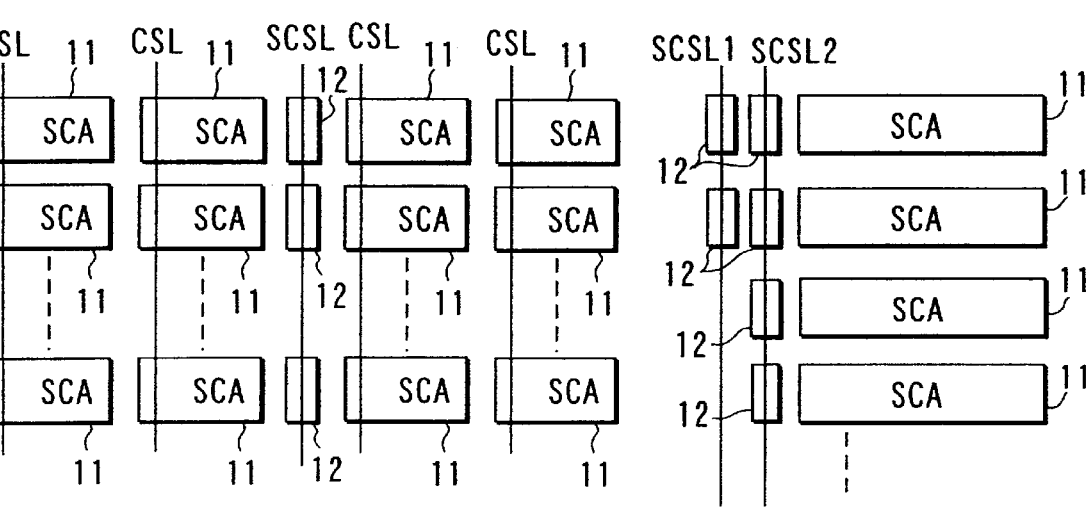
FIG. 10
FIG. 11
FIG. 12
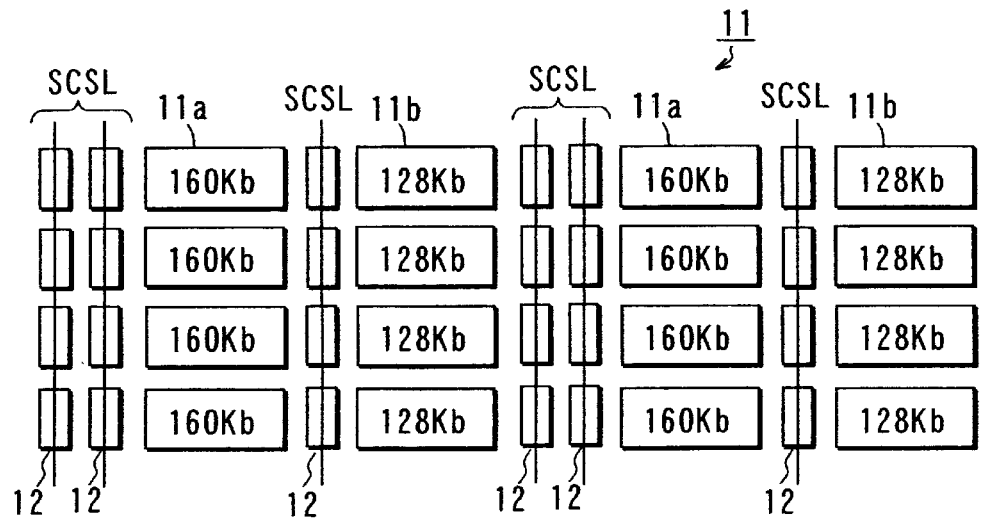
FIG. 13

SEMICONDUCTOR DEVICE WITH FLEXIBLE REDUNDANCY SYSTEM

CROSS-REFERENCE TO RELATED APPLICATIONS

This application is a continuation of prior application Ser. No. 09/739,240, filed Dec. 19, 2000, which is a continuation of prior application Ser. No. 09/296,269, filed Apr. 22, 1999, now U.S. Pat. No. 6,188,618 which claims priority under 35 U.S.C. §119 to Japanese patent application 11-108096, filed Apr. 15, 1999 and Japanese patent application 10-112967, filed Apr. 23, 1998. The entire disclosures of the prior applications are hereby incorporated by reference herein.

BACKGROUND OF THE INVENTION

This invention relates to a semiconductor device with a flexible redundancy system for saving a defective memory cell.

Semiconductor devices have a redundancy system. To enhance the yield of products, the redundancy system saves a defective memory cell, if any, by replacing it with a redundancy cell. The redundancy system that is most generally used at the present stage performs such replacement in units of a cell array, more specifically in units of a plurality of rows or columns (there is a case where it is done in units of one row or column). If in this system, a defective memory cell is found after a test, a cell array including the defective cell is replaced with a-redundancy cell array (spare element) of the same size.

Address information on a cell array including the defective cell is stored in a non-volatile storage element. A fuse is generally used as the storage element at the present stage. Since the address information is usually formed of several bits, a fuse set which includes a plurality of fuses corresponding to the address information is a unit of redundancy. Further, usually, one spare element corresponds to one fuse set, and the same number of fuse sets as:the spare elements are employed in a chip. When using a spare element, a fuse included in a fuse set corresponding thereto is cut. Since this system is of a simple structure, it is widely used now.

On the other hand, the redundancy system requires a spare element and a fuse set in addition to a usual circuit, and hence requires a large chip area. In light of the fact that the area of a redundancy circuit and the number of defective cells which the redundancy circuit can save have a trade-off relationship, various types of redundancy systems are now proposed for enhancing the area efficiency. For example, Kirihata et al. propose a flexible redundancy system (see "Fault-Tolerant Designs for 256 Mb DRAM" (IEEE JOURNAL of SOLID-STATE CIRCUITS, VOL. 31, NO. 4, April 1996)). Since in this system, a single spare element covers a wide cell array area, even when defective cells exist in only a part of a chip, they can be saved in a similar manner to a case where defective cells are uniformly dispersed within a cell array. Accordingly, the number of spare elements can be reduced, thereby increasing the area efficiency of the redundancy circuit.

As described above, where the number of defective cells per one chip is detected or can be estimated, to save them using a small number of spare elements can increase the area efficiency and hence be more effective. In particular, where a single spare element can cover a wide cell array area, the above system is effective.

However, memory chips in which a memory cell array is divided into portions have been developed. For example, there is a memory chip provided with a plurality of banks which are simultaneously activated. This type of memory chip cannot have a spare element for saving a defective cell which is included in any other bank. The larger the number of banks, the larger the number of divisions of a memory cell array, and the narrower the cell array area that each spare element can cover. Although this is mainly a problem of a row spare element, a similar problem will occur with a column spare element. Moreover, if in memory devices operable at high speed, the distance between a memory cell and another replaced by a spare element becomes longer than before the replacement, transmission delay of a signal or data becomes greater, thereby degrading the high speed operability. On the other hand, to maintain the high speed operability, replacement must be performed between memory cells located close to each other. This means that the column spare element cannot cover a wide cell array area.

When the spare element can cover only a narrow range from the limitations such as the number of banks, a spare element must be provided in units of one narrow cell array area to save even defective cells located at only a part of a memory cell. This means that a great number of spare elements, which significantly exceeds the average number of defective cells, must be incorporated in one chip, thereby degrading the area efficiency. Moreover, in the conventional system in which one spare element corresponds to one fuse set, the number of fuse sets inevitably increases with an increase in the number of spare elements. Since, in general, fuses require a larger area than spare elements, the system in which one spare element corresponds to one fuse set results in a large decrease in the area efficiency of the redundancy circuit.

BRIEF SUMMARY OF THE INVENTION

This invention has been developed to solve the above-described problems, and has its object to provide a semiconductor device that employs a redundancy circuit of a high saving efficiency and a high area efficiency on a chip, in which the redundancy circuit requires only a small number of non-volatile storage elements to save a defective memory cell.

The object is realized by a device described as below.

A semiconductor storage device comprising: a memory cell array having memory cells arranged in columns and rows, the memory cell array being-divided into a plurality of sub cell arrays; redundancy cell arrays each located adjacent to a corresponding one of the sub cell arrays; row decoders for each selecting a corresponding one of the rows of the memory cell array in accordance with an input address; column decoders for each selecting a corresponding one of the columns of the memory cell array in accordance with an input address; a plurality of storage circuits for storing addresses assigned to defective memory cells included in the memory cell array, and also storing mapping information indicative of the relationship between the storage circuits and the redundancy cell arrays, the storage circuits outputting, when an address assigned to one of the defective memory cells stored therein matches an input address, a replacement control signal for the defective memory cell on the basis of the result of matching, and the mapping information; and spare decoders each to be activated by the replacement control signal supplied from the storage circuits to thereby select a corresponding one of the redundancy cell arrays.

Furthermore, the object of the invention is realized by a device as below.

A semiconductor storage device comprising: a memory cell array having memory cells arranged in columns and rows, the memory cell array being divided into a plurality of sub cell arrays; redundancy cell arrays each located adjacent to a corresponding one of the sub cell arrays; row decoders for each selecting a corresponding one of the rows of the memory cell array in accordance with an input address; column decoders for each selecting a corresponding one of the columns of the memory cell array in accordance with an input address; a plurality of storage circuits each: including: a plurality of first storage elements for storing addresses assigned to defective memory cells included in the memory cell array; a plurality of second storage elements for storing mapping information which indicates the relationship between the redundancy cell arrays and the storage circuits; a plurality of comparators each for comparing the address of a corresponding one of the defective memory cells stored in a corresponding one of the first storage elements with an input address, and outputting, when the stored address matches the input address, a signal indicating that those addresses match each other; and a decoder for decoding the mapping information stored in the second storage elements when each of the comparators has output the signal indicating that the addresses match each other; and spare decoders each to be activated by the output signal of the decoder to thereby select a corresponding one of the redundancy cell arrays.

In the invention, defective cells can be saved in a reliable manner even when they are located at only one area of the memory cell array, by virtue of the structure in which the redundancy cell arrays and mapping information indicative of the relationship between circuits for storing defective cells are stored in the circuits. Moreover, in the invention, the area efficiency of the redundancy circuit can be enhanced by reducing the number of redundancy cell arrays necessary to save defective cells.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a block diagram showing a further modification of the arrangement of the sub cell arrays and the spare elements;

FIG. 11 is a block diagram showing yet another modification of the arrangement of the sub cell arrays and the spare elements;

FIG. 12 is a block diagram showing another modification of the arrangement of the sub cell arrays and the spare elements;

FIG. 13 is a block diagram showing a further modification of the arrangement of the sub cell arrays and the spare elements;

DETAILED DESCRIPTION OF THE INVENTION

The embodiment of the invention will be described with reference to the accompanying drawings.

Figure 1:
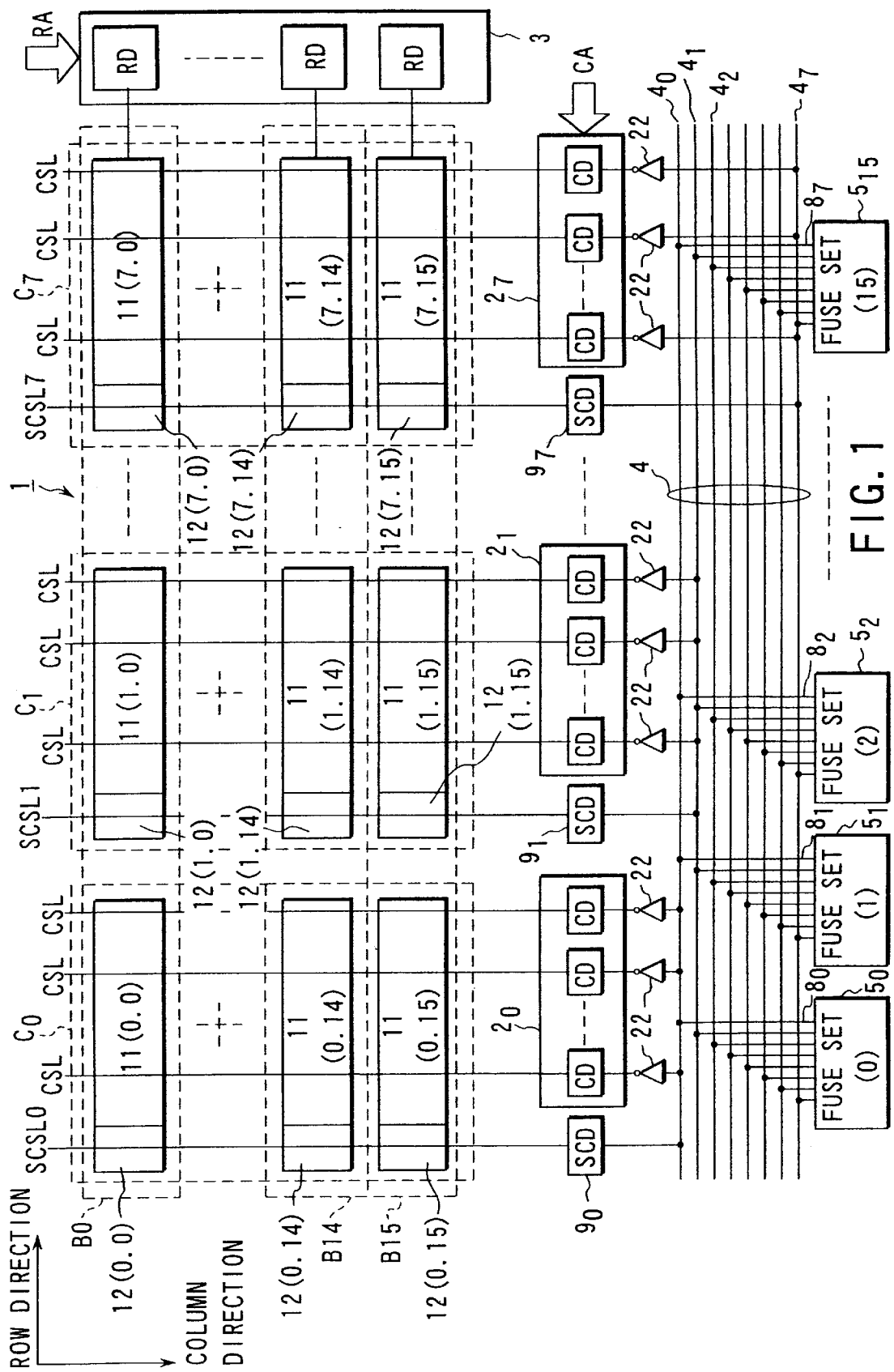
FIG. 1 is a block diagram illustrating an essential part of a DRAM according to the embodiment of the invention.

FIG. 1 shows an illustrative structure of a DRAM according to the embodiment of the invention. A memory cell array 1 is divided into sub cell arrays (SCA) 11 (m, n) arranged in a matrix of M (rows)×N (columns). Specifically, the memory cell array 1 is divided into 128 sub cell arrays 11 (m, n) (m: 0–7, n: 0–15) which are obtained by arranging 8 sub cell arrays in each row (M=8) and 16 sub cell arrays in each column (N=16). The division unit of the sub cell arrays 11 is determined on the basis of, for example, the number of columns which can simultaneously transmit data to a data line, and the number of rows (the number of word lines) which are connected to a single sense amplifier array and included in continuous bit lines. In this embodiment, the division unit is also a saving unit in which defective memory cells are saved by a single spare element (redundancy cell array). However, it is possible to save a plurality of defective sub cell arrays using one spare element.

The 8 sub cell arrays 11 arranged in each row constitute a single bank, and in total, 16 banks Bn (n: 0–15) are provided in this embodiment. Further, 16 sub arrays arranged in each column constitute a sub array column, and in the FIG. 1 case, 8 sub cell array columns Cm (m: 0–7) are arranged. A row decoder Id circuit 3 for decoding a row address RA supplied from the outside of the cell array 1 is located at each row-directional end of the cell array 1, while a column decoder circuit 2m for decoding a column address CA supplied from the outside of the array 1 is located at each sub cell array column Cm. The memory cells are selected using these row decoder circuits 3 and the column decoder circuits 2m.

Figure 2:
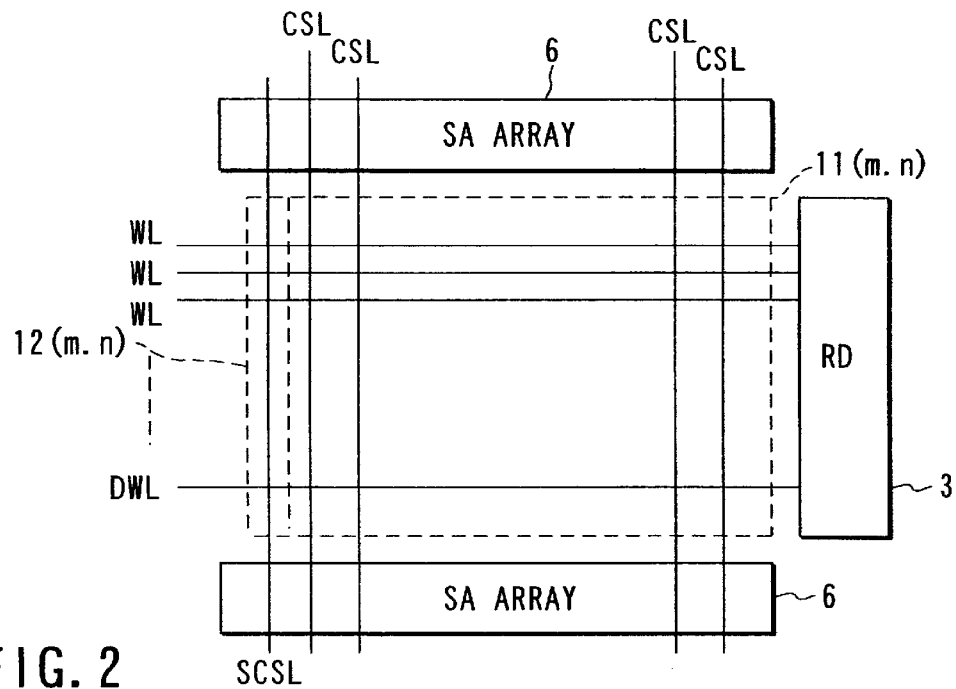
FIG. 2 is a block diagram illustrating a specific structure of a sub cell array incorporated in FIG. 1.

Each sub cell array 11 includes a plurality of word lines WL, dummy word lines DWL, and a plurality of column selecting lines CSL perpendicular to the word lines, as is shown in FIG. 2. Although the capacitance of each sub cell array 11 is optional, in this embodiment, 16 column selecting lines CSL are included in each sub cell array 11. Further, as shown in FIG. 2, sense amplifier arrays 6 are arranged on the opposite sides of each sub cell array 11 for reading data from bit lines selected by the column selecting lines CSL.

These sense amplifier arrays 6 are of a so-called shared sense amplifier system which is commonly used by adjacent sub cell arrays. However, they are not limited to the shared sense amplifier system, but may have a structure in which a sense amplifier array is provided for each sub cell array.

A spare element 12 (m, n) as a redundancy cell array is located at a row-directional end of each sub cell array 11, and a spare column selecting line SCSLm (m: 0–7) is located parallel to the column selecting lines CSL for selecting the spare element 12.

Figure 3:
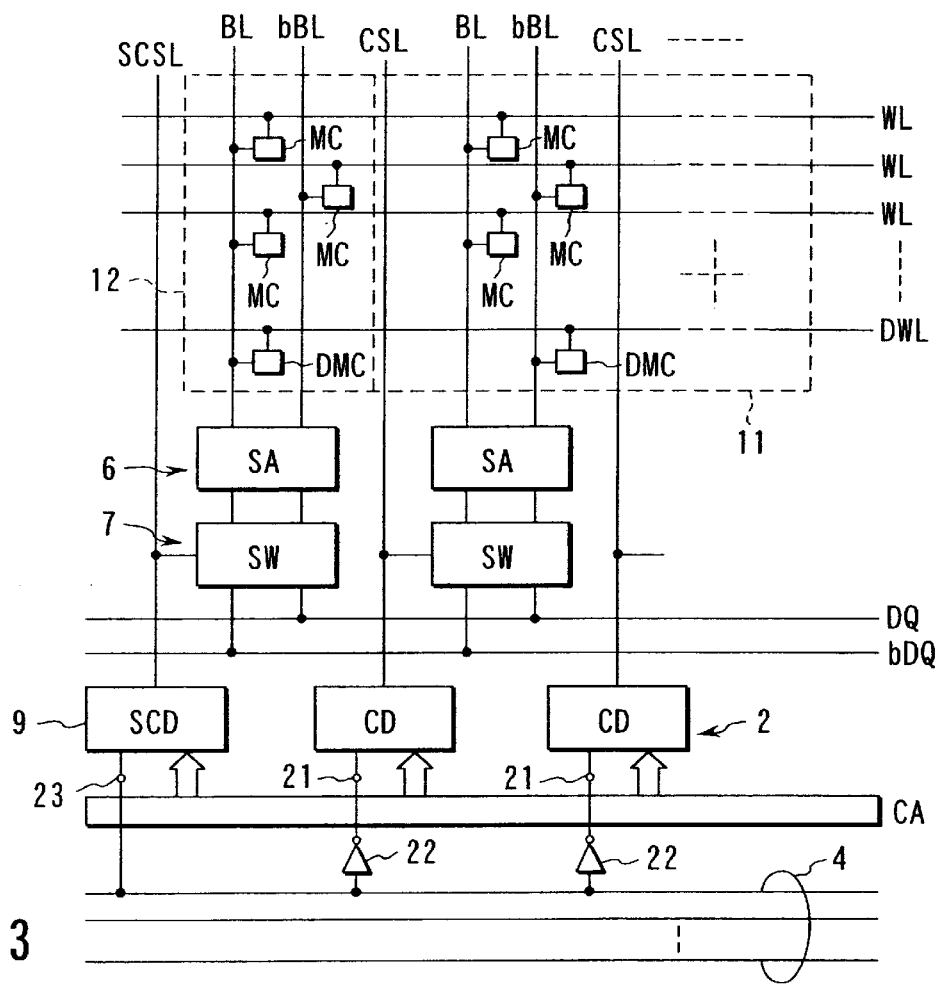
FIG. 3 is a circuit diagram showing a sub cell-array and its peripheral circuit incorporated in FIG. 1.

FIG. 3 specifically illustrates the structure shown in FIG. 2. In FIG. 3, the spare element 12 has a pair of redundancy bit lines BL and bBL (hereinafter, "b" indicates an inverted signal). However, the spare element is not limited to this structure, but may have a plurality of pairs of redundancy bit lines. Memory cells MC and dummy memory cells DMC similar to those of each sub cell array 11 are connected to the redundancy bit lines BL and bBL which constitute the spare element 12. These memory cells MC and dummy cells DMC are respectively selected by the word lines WL and the dummy-word line DWL which extend from the sub cell array 11.

As is shown in FIG. 1, the column selecting lines CSL and the spare column selecting lines SCSL extend through the 16 (=N) sub cell arrays 11 and spare elements 12. The column decoder circuits (CD) 2 for selecting the column selecting lines CSL are commonly provided for the 16 (=N) sub cell arrays 11 arranged in each column. A spare column decoder (SCD) $9m$ is located adjacent to each column decoder circuit 2. The spare column decoders (SCD) $9m$ drive the spare column selecting lines SCSL commonly connected to the 16 (=N) spare elements 12.

As is shown in FIG. 3, the pair of bit lines BL and bBL of the sub cell arrays 11 and the spare elements 12 are connected to sense amplifiers (SA) which constitute the sense amplifier arrays 6. A column selecting switch circuit (SW) 7 is connected between a corresponding sense amplifier 6 and a corresponding pair of data lines DQ and bDQ. The column selecting switch circuits (SW) 7 are connected to the column selecting lines CSL and spare column selecting lines SCSL and selectively on/off controlled by signals therefrom. When reading data, data transmitted through the bit lines BL and bBL are amplified by the sense amplifier (SA), and output to the data lines DQ and bDQ when the switch circuit 7 is turned on.

As is shown in FIG. 1, this embodiment employs 16 (=N) fuse sets $5n$ (n: 0–15) whose number is identical to the number of the row-directional sub cell arrays 11 (i.e. the number of banks). Each fuse set $5_0$–$5_{15}$ stores an address assigned to a defective memory cell (which will be referred to as a "defective address"), and compares an address supplied from the outside. If the comparison result indicates that they are identical to each other, a corresponding spare element 12 outputs a signal for instructing replacement of a corresponding defective column. This signal is supplied to the spare column decoder of a corresponding sub cell array, and an inverted signal of the signal is supplied to the column decoder of the corresponding sub cell array. Further, each fuse set $5_0$–$5_{15}$ stores information (mapping information) on the relationship between themselves and the 8 spare column selecting lines $SCSL_0$–$SCSL_7$. Particulars will be described later.

This embodiment employs the same number (M×N) of spare elements 12 as the number (M×N) of sub cell arrays 11, and the same number of fuse sets 5 as the number of the column-directional sub cell arrays 11. However, the invention is not limited to this. In other words, the present invention differs from the conventional case in that the former uses mapping information indicative of the relationship between the fuse sets and the spare elements. In the conventional case, one fuse set is prepared for one spare-element. On the other hand, in this embodiment, each fuse set is made to correspond to an optional spare element by the mapping information. As a result, the number of required fuse sets can be set smaller than the number of spare elements. Moreover, even where defective cells uniformly disperse or locally gather, they can be saved. The relationship between the number $N_{fs}$ of fuse sets and the number of spare elements in the present invention is expressed by $$N_{fs} \leq M \times N$$

Each fuse set $5_0$–$5_{15}$ has 8 output lines $8_0$–$8_7$. When rewriting a defective column selecting line, one of the output lines $8_0$–$8_7$ is activated. The output lines $8_0$–$8_7$ of each fuse set $5_0$–$5_{15}$ are connected to 8 replacement control signal lines $4_0$–$4_7$, respectively, thereby constituting a wired OR circuit. When replacing a defective cell, one of the 8 replacement control signal lines $4_0$–$4_7$ is set at high level in accordance with a high level signal output from one of the fuse sets $5_0$–$5_{15}$. When one of the replacement control signal lines $4_0$–$4_7$ is at high level, one of the spare column selecting lines SCSL is selected by one of the spare column decoders (SCD) to which the high level signal is supplied. At the same time, those of the column decoders (CD) to which the high level signal is supplied via an inverter circuit 22 cause the column selecting lines CSL of a corresponding sub cell array 11 to be non-selected. Thus, the 8 replacement control signal lines $4_0$–$4_7$ control the 8 column decoder circuits $2_0$–$2_7$ and the spare column decoders $9_0$–$9_7$ adjacent to the column decoder circuits.

The operation of the replacement control signal lines 4 will be described in more detail. The first replacement control signal line $4_0$ selectively activates the column decoder circuit $2_0$ and the spare column decoder $9_0$ adjacent thereto. To this end, the input terminal of each column decoder (CD) included in the column decoder circuit $2_0$ is connected to the replacement control signal line $4_0$ via the inverter 22, while the input terminal of the spare column decoder (SCD) $9_0$ is directly connected to the replacement control signal line $4_0$. Accordingly, when the replacement control signal line $4_0$ is at high level, the spare column decoder $9_0$ is activated, whereas the column decoder circuit $2_0$ is deactivated. As a result, the spare column selecting line $SCSL_0$ is selected in place of the column selecting line CSL selected by the column decoder circuit $2_0$, thereby reading data from the spare elements 12 connected to the line $SCSL_0$.

Similarly, the second et seq. replacement control signal lines $4_1$, $4_2$, . . . selectively activate the column decoder circuits $2_1$, $2_2$, . . . and the spare column decoders $9_1$, $9_2$, . . . adjacent thereto. When in this structure, the spare column selecting line SCSL has been selected in an optional sub cell array, the column selecting line SCL is deactivated, thereby replacing a defective cell with a spare cell.

Figure 4:
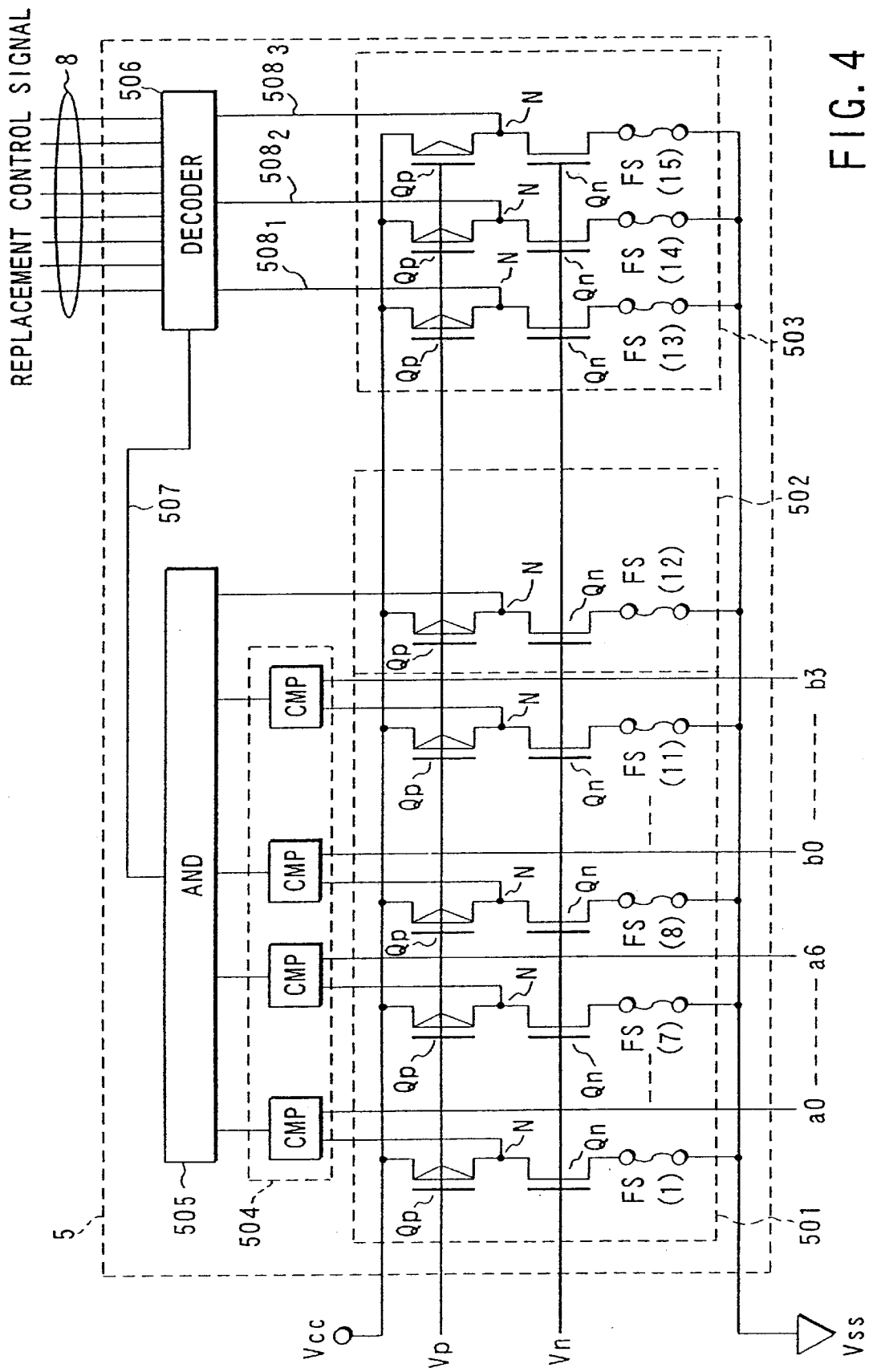
FIG. 4 is a circuit diagram showing a fuse set incorporated in FIG. 1.

FIG. 4 shows one of the fuse sets $5_0$–$5_{15}$ of FIG. 1 in detail. A description will be given of the one fuse set since they have the same structure. The fuse set 5 comprises an address designating fuse circuit 501 for storing a defective address in the memory cell array 1, an enable fuse circuit 502 for storing whether or not the fuse set 5 is used, and a mapping fuse circuit 503 which pre-stores the address of one of the 8 spare column selecting lines SCSL corresponding to the fuse set 5.

The address designating fuse circuit 501 has 11 fuses FS. Seven (1)–(7), for example, of the fuses FS are used to designate a minimum unit of the column address. The remaining 4 fuses FS (8)–(11) are used to select 16 spare elements 12 using a single spare column selecting line SCSL. More specifically, the address designating fuse circuit 501 includes address information for designating a defective memory cell in a corresponding sub cell array 11, and address information for selecting 16 banks Bn (n: 0–15). The mapping fuse circuit 503 has three fuses FS (13)–(15) necessary to select the 8 spare column selecting lines SCSLm. In other words, the mapping fuse circuit 503 stores address information for selecting one of the 8 sub cell array columns Cm (m: 0–7) arranged in the row direction.

Each fuse FS included in the fuse circuits 501–503 is connected in series to a pre-charging PMOS transistor Qp and a selecting NMOS transistor Qn between a power voltage Vcc and a ground potential Vss. A connection node N between the PMOS transistor Qp and the NMOS transistor Qn is an output node. After the PMOS transistor Qp is turned on to pre-charge the output node N with the power voltage Vcc, the PMOS transistor Qp is turned off and the NMOS transistor Qn is turned on, thereby reading fuse data. If the fuse FS is cut as indicated by the broken line, a high-level voltage (Vcc) is output from the output node N, whereas if the fuse FS is not cut, a low-level voltage (Vss) is output from the output node N.

A signal output from the fuse circuit 501 is supplied to an address match detecting circuit 504 formed of a plurality of comparators CMP, together with column addresses a0–a6 and addresses b0–b3. The addresses b0–b3 are necessary to select 16 spare elements 12 using a single spare column selecting line SCSL. The address match detecting circuit 504 detects whether or not data contained in the output signal of the fuse circuit 501 matches the column addresses a0–a6 and addresses b0–b3. The output signals of the address match detecting circuit 504 and the enable fuse circuit 502 are supplied to an AND gate 505. The output terminal of the AND gate 505 outputs a Match signal 507 (i.e. an enable signal for replacing a defective cell) indicating that an address supplied from the outside matches fuse information. The Match signal 507 is supplied to a decoder 506. The decoder 506 is connected to three output signal lines 508$_1$, 508$_2$ and 508$_3$ of the mapping fuse circuit 503. When the Match signal 507 has been activated, the decoder 506 decodes the output signal of the mapping fuse circuit 503. As a result, one of the 8 output lines 8 of the decoder 506 is activated and serves as a replacement control signal for activating one of the replacement control signal lines 4.

The address designating fuse circuit 501 has 11 fuses, the enable fuse circuit 502 has one fuse, and the mapping fuse circuit has three fuses. This is, however, merely an example. The number of fuses of the address designating fuse circuit 501 is increased or decreased in accordance with the capacitance of the sub cell array 11 and the capacitance of the bank, while the number of fuses of the mapping fuse circuit 503 is increased or decreased in accordance with the number of sub cell array columns. The enable fuse circuit 502 can have a plurality of fuses.

Figure 5:
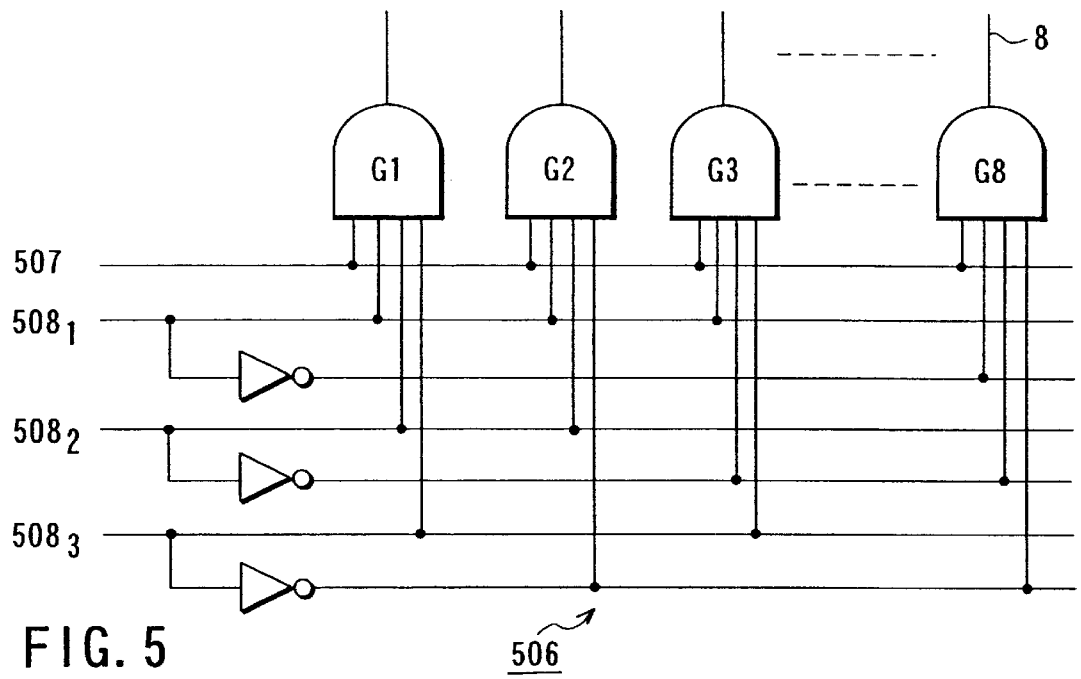
FIG. 5 is a circuit diagram illustrating the structure of p decoder incorporated in FIG. 4.

FIG. 5 shows an example of the decoder 506. The decoder 506 is formed of 8 AND gates G1–G8 for receiving three signals output from the fuse circuit 503, their inverted signals, and the Match signal 507. The replacement control signal is output from the AND gates G1–G8.

In the above-described embodiment, one spare element 12 is provided for each of the 128 sub cell arrays 11, and 16 fuse sets are provided for-the entire array 1 to enable saving of 16 sub cell arrays 11. Furthermore, each fuse set 5 has the address designating fuse circuit 501 for storing a defective address, and the mapping fuse circuit 503 for storing mapping information indicating how to make the 16 fuse sets 5 correspond to the 8 sub cell array columns Cm. One of the 8 replacement control signal lines 4 is selected from the mapping information so that each fuse set 5 will be assigned to an optional sub cell array column Cm. Accordingly, even when defective portions disperse in the memory cell array or gather in a certain area thereof, the 16 fuse sets 15 can be used effectively.

Specifically, suppose that the memory cell array 1 shown in FIG. 1 has 16 defective cells along one column selecting line CSL of the sub cell array column $C_0$. In this case, all the 16 fuse sets $5_0$–$5_{15}$ store mapping information for activating the replacement control signal line $4_0$, and the 16 defective cells along the one column selecting line can be saved by the 16 fuse sets $50$–$5_{15}$.

Figure 14:
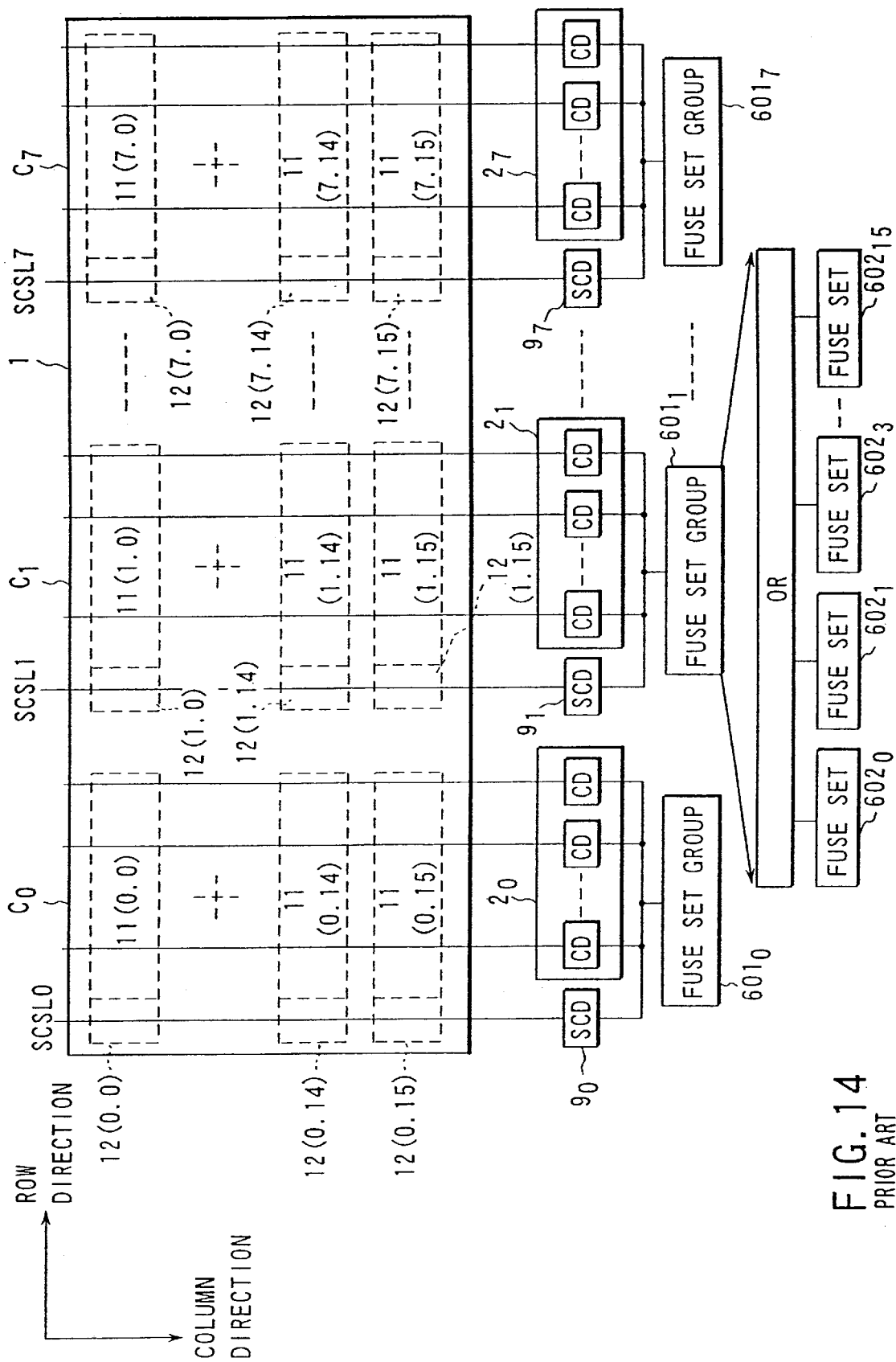
FIG. 14 is a block diagram illustrating an example of a conventional redundancy system.
Figure 15:
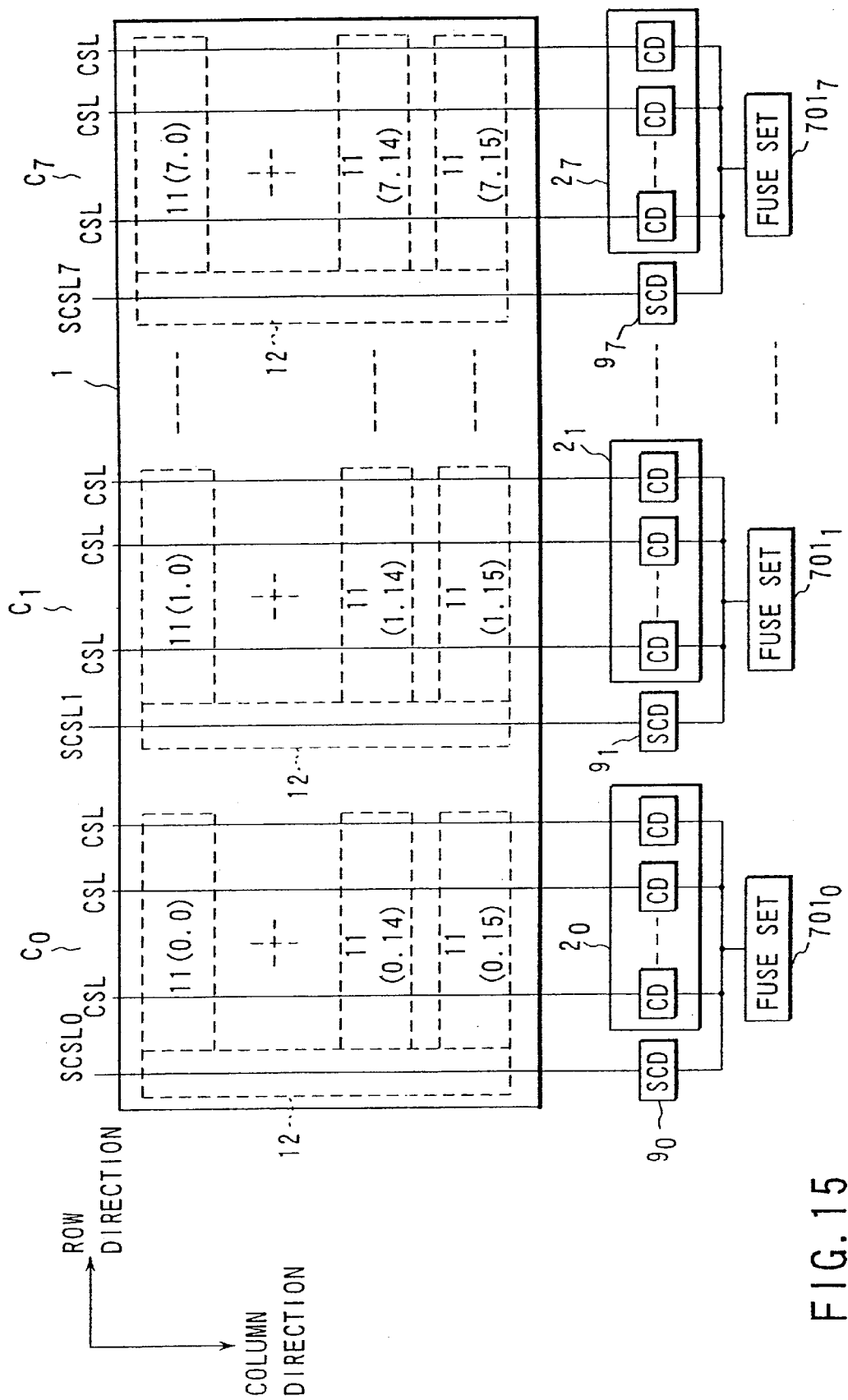
FIG. 15 is a block diagram illustrating another example of a conventional redundancy system.

The advantage of the redundancy system of this embodiment will be described in detail, referring to FIGS. 14 and 15 which show the conventional redundancy systems. In FIGS. 14 and 15, elements similar to those in FIG. 1 are denoted by corresponding reference numerals.

In the conventional system shown in FIG. 14, a spare element 12 (m, n) is provided for each of 128 sub cell arrays 11 (m, n). This structure is similar to the present invention. However, in the FIG. 14 case, a fuse set group 601 (601$_0$–601$_7$) is provided for each spare column selecting line SCSL. Each fuse set group 601 has 16 fuse sets 602 (602$_0$–6021$_{15}$) which correspond to 16 spare elements 12 arranged along the spare column selecting line SCSL. For example, the fuse set 602$_0$ corresponds to the spare element 12 (1, 0), while the fuse set 602$_{15}$ corresponds to the spare element 12 (1, 15). Thus, one spare element 12 is made to correspond to one fuse set 602. Supposing that the number of addresses in this case is the same as in the embodiment, the number of fuses is 1024 (={7 (for addresses)+1 (for enable)}×16×8). This number is 4.3 times greater the number of fuses used in the embodiment.

Since in the FIG. 14 conventional case, the 128 spare elements 12 can be replaced with defective cells, the degree of saving is high as in the embodiment. However, where the average number of defective cells which will occur in one chip is supposed to be about 10, the number of fuse sets actually used is about 10. Thus, a large number of fuse sets are not used to save defective cells. The defective cell saving efficiency is very low for the area occupied by the redundancy circuit on the chip.

In the other conventional case shown in FIG. 15, a single spare element 12 is commonly provided for a plurality of sub cell arrays 11 arranged in each column. Fuse sets 701$_0$–701$_7$ are provided for sub cell array columns $C_0$–$C_7$, respectively. In this case, the number of fuses is as small as 64 (={7 (for addresses)+1 (for enable)}×8). However, supposing that the average number of defective cells which will occur in one chip is about 10 as stated above, the 8 spare elements 12 is too few to obtain a sufficient saving efficiency and a sufficient yield of chips.

On the other hand, in the case of the embodiment of the present invention, the number of spare elements 12 is 128 in the memory cell array 1, while the number of fuses is 240 (={7 (for addresses)+4 (for spare element selection)+1 (for enable)+3 (for mapping)}×16). Thus, the number of fuses in the embodiment is much smaller than in the FIG. 14 case. Moreover, rewriting of a defective cell can be performed by selecting any one of the 128 spare elements. This means that the saving efficiency is high.

Figure 6:
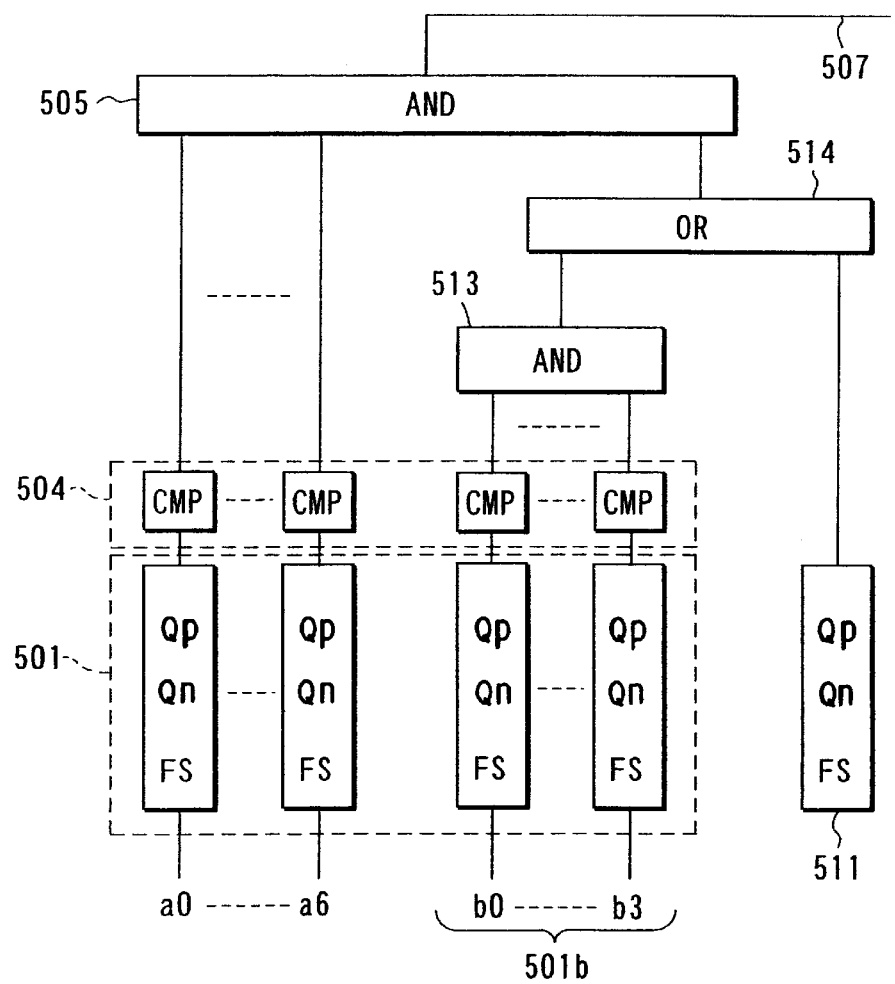
FIG. 6 is a block diagram illustrating a modification of the fuse set.

FIG. 6 shows a modification of the fuse set. When there are a plurality of defective cells along a certain column selecting line in the above-described embodiment, address information on each defective cell is supplied to the mapping fuse circuit 503 so as to program the circuit to deal with the defective cells using a plurality of fuse sets. On the other hand, where all memory cells along a single column selecting line are defective, they can be saved by a single fuse set if the structure of the fuse set shown in FIG. 4 is modified as shown in FIG. 6. In FIG. 6, a fuse circuit 511, an AND gate 513 and an OR gate 514 are added to the fuse set shown in FIG. 4. The fuse circuit 511 is an enable fuse circuit which has a single fuse and is adapted to indicate whether or not the fuse set is being used. The AND gate 513 receives that one of the output signals of the match detecting circuit 504, which corresponds to a bank address designating circuit section 501b. The output signals of the AND gate 513 and the fuse circuit 511 are supplied to the OR gate 514, which in turn supplies its output to the AND gate 505.

If all memory cells along a certain column selecting line are defective in the above structure, the fuse of the fuse circuit 511 of a corresponding fuse set is cut. In the structure, it is not necessary to program the bank address designating circuit 501b of the address designating fuse circuit 501.

When in this structure, a defective column address is input, the Match signal 507 is made high by the output signal of the fuse circuit 511 irrespective of the bank address. In other words, when all cells along a single column selecting line are defective, they can be saved using a single fuse set. Accordingly, defective cells can be saved depending on the circumstances such as the number of them or their places.

Although one spare element 12 is provided for each sub cell array 11 in the embodiment, the invention is not limited to this. The arrangement or the number of spare elements 12 can be modified in various manners as shown in FIGS. 7–12.

Figure 7:
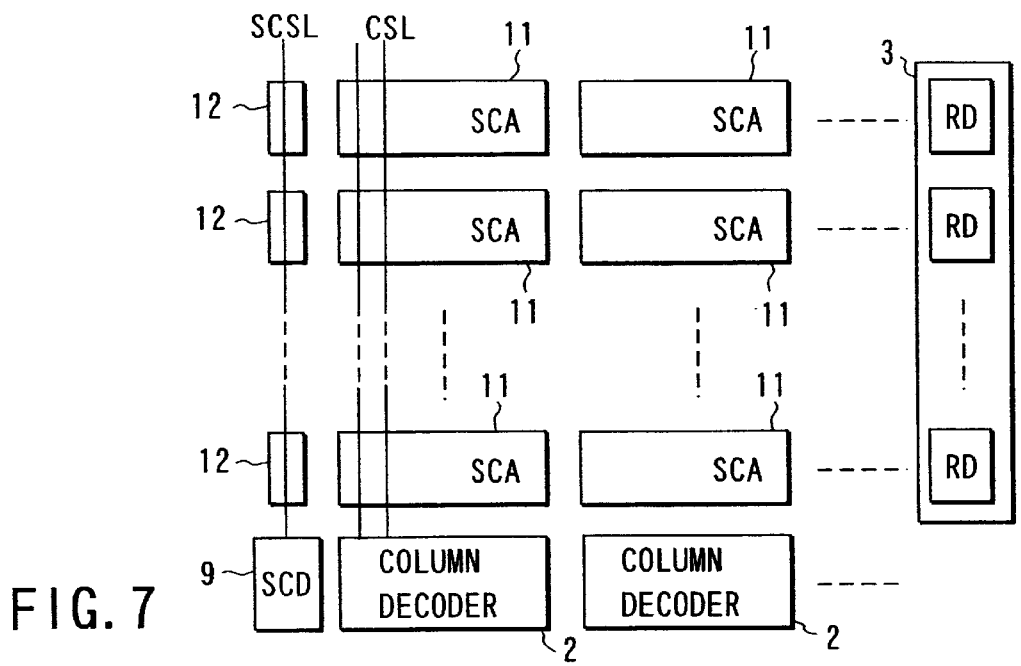
FIG. 7 is a block diagram illustrating an arrangement of sub cell arrays and spare elements.

FIG. 7 shows an example in which one spare element 12 is provided for a plurality of sub cell arrays 11 arranged in each row. In this case, a single spare element 12 is used to save any defective cell included in the sub cell arrays 11 arranged in each row. The number of spare elements 12 is obtained by dividing the number (M×N) of sub cell arrays 11 by N.

Since the FIG. 7 structure employs a small number of spare elements, it is effective when the density of defective cells is low. This structure can reduce the area of the redundancy system without degrading its saving efficiency.

Figure 8:
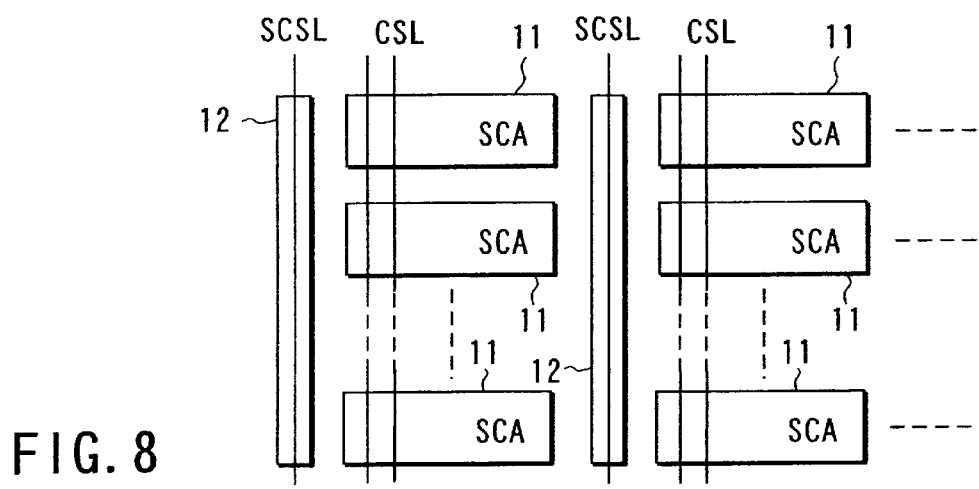
FIG. 8 is a block diagram showing a modification of the arrangement of the sub cell arrays and the spare elements.

FIG. 8 shows an example in which one spare element 12 is commonly provided for a plurality of sub cell arrays 11 arranged in each column. In this case, defective cells included in sub cell arrays 11 arranged along a certain column selecting line CSL can be replaced with a spare element 12 at a time. Further, this structure enables reduction of the number of fuses included in one fuse set, the number of comparator circuits, and the number of AND gates, thereby reducing the required chip area and enabling a high speed operation.

Figure 9:
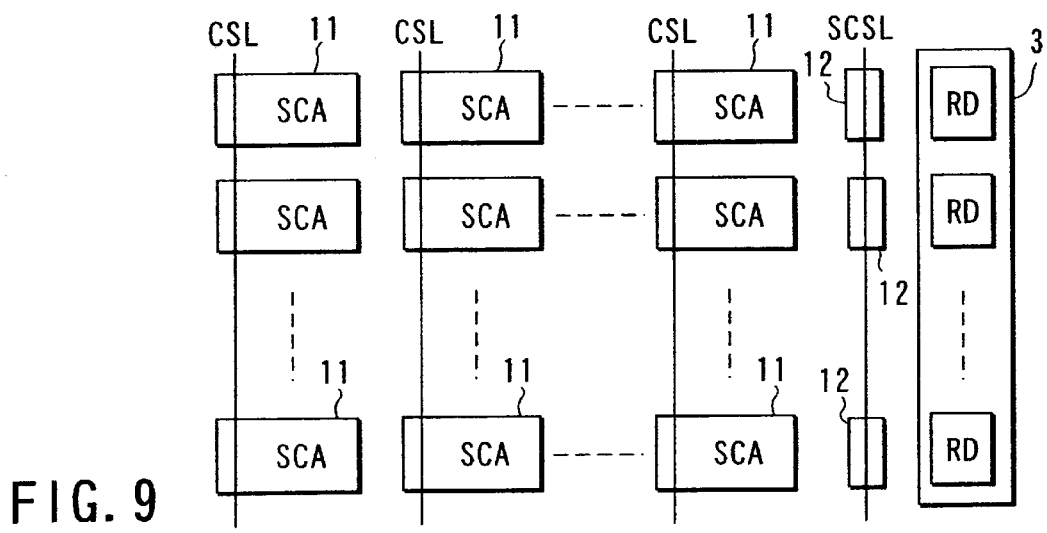
FIG. 9 is a block diagram showing another modification of the arrangement of the sub cell arrays and the spare elements.

FIG. 9 shows an example in which a spare element 12 is interposed between each sub cell array 11 and a corresponding row decoder 3. If in this structure, an input/output circuit is provided in the vicinity of the row decoders, data can be transferred at high speed between the input/output circuit and a selected spare element.

FIG. 10 shows an example in which a row decoder is interposed between each sub cell array 11 and a corresponding spare element 12. This structure can provide the same advantage as the FIG. 9 structure.

FIG. 11 shows an example in which a spare element 12 is provided in a middle portion of sub cell arrays 11 arranged in each row. This structure can also provide the same advantage as the FIG. 9 structure.

In FIGS. 9–11, each spare elements 12 can be provided for sub cell arrays 11 arranged in a corresponding column, as in the FIG. 8 case.

FIG. 12 shows a case where the number of spare elements 12 differs between portions of the memory cell array 1. Specifically, two spare elements 12 are provided for a certain sub cell array 11, while one spare element 12 is provided for another sub cell array 11. In general, a defective portion is liable to occur in an area, where the continuity of a pattern is interrupted, such as an end portion of the chip or of the memory cell array. A plurality of defective portions can be saved by arranging a plurality of spare elements adjacent to a sub cell array located in an area, where the continuity of a pattern is interrupted, such as an end of the chip or of the memory cell array as shown in FIG. 12.

FIG. 13 shows a case where the number of spare elements differs in accordance with the capacitance of a sub cell array. For example, there is a memory device, such as a memory with a parity bit or a DRAM conformable to a Rambus, in which a memory cell array is divided into sub cell arrays of different capacitances. In such a memory cell array, the density of defective cells differs in accordance with the capacitance of each sub cell array. In a memory cell array 11 shown in FIG. 13, a sub cell array 11a has a capacitance of 160 K bits, while a sub cell array 11b has a capacitance of 128 K bits. In this case, the degree of occurrence of defective cells is higher in the sub cell array 11a than in the sub cell array 11b. Accordingly, two spare elements are provided for the sub cell array 11a, and one spare element is for the sub cell array 11b.

Since in the above structure, plural spare elements are provided only for a sub cell array in which defective cells of a high density will occur, the number of required spare elements can be minimized, thereby enhancing the saving efficiency of defective cells.

The invention can be modified in various-manners. For example, although in the embodiment, a description has been given to a case where a defective column selecting line, i.e. a defective bit line, is replaced with a spare element, the invention is also applicable to a case where a defective word line is replaced with a spare element.

Furthermore, although the embodiment uses a fuse as a non-volatile storage element that constitutes a defective address storage circuit, any other non-volatile semiconductor storage element such as a ROM, EPROM, EEPROM, etc. can be used.

In addition, the invention is applicable not only to a semiconductor storage device as one unit, but also to a storage device merged with a logic circuit, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor memory device comprising:
   a memory cell array having memory cells arranged in columns and rows, said memory cell array being divided into a plurality of banks;
   a plurality of redundancy units for replacement of defective memory cells in said memory cell array; and
   a plurality of storage circuits each configured to store an address assigned to a defective memory cell, mapping information indicative of a relationship with said redundancy units, and address information to select said banks, said storage circuits each outputting a replacement control signal for said defective memory cell on the basis of said mapping information and said address information, when the address assigned to said defective memory cell stored therein matches an input address.

2. The semiconductor memory device according to claim 1, wherein said storage circuits each include:

an address designating fuse circuit configured to store an address assigned to said defective memory cell and address information to select said banks;

a mapping fuse circuit configured to store mapping information which indicates the relationship between said redundancy units and said storage circuit;

an address match detecting circuit configured to detect whether the address stored in said address designating fuse circuit matches the input address and to generate an output signal indicating that a match has been detected, and;

a decoder configured to decode an output signal of said mapping fuse circuit when said address match detecting circuit has generated the output signal, thereby creating the replacement control signal.

3. The semiconductor memory device according to claim 2, wherein said address designating fuse circuit and said mapping fuse circuit each include:

a first transistor which is coupled to a power supply voltage, said first transistor precharging the output signal of its respective circuit; and a second transistor which is arranged between said first transistor and a ground voltage.

4. The semiconductor memory device according to claim 1, further comprising spare decoders for replacing normal decoders, each of said spare decoders being activated by the replacement control signal from a corresponding one of the storage circuits, thereby selecting a corresponding one of the redundancy units.

5. The semiconductor memory device according to claim 4, wherein each of the spare decoders is connected to a corresponding one of the replacement control signal lines, and each of the normal decoders corresponds to said one of the spare decoders is connected to said corresponding one of the replacement control signal lines via an inverter circuit.

6. The semiconductor memory device according to claim 1, wherein each of the storage circuits has a plurality of output terminals for outputting the replacement control signal, the output terminals of each of the storage circuits being connected to each other by a plurality of replacement control signal lines, and consisting of a wired OR circuit.

7. The semiconductor memory device according to claim 1, wherein the number of storage circuits is smaller than the number of redundancy units.

8. A semiconductor memory device comprising:

a memory cell array having memory cells arranged in column and rows and being divided into a plurality of sub cell arrays, said sub cell arrays being arranged in a number M of rows and a number N of columns, and sub-arrays arranged in each row constituting one of a plurality of banks;

redundancy units each located corresponding to one of said plurality of banks;

row decoders each configured to select a corresponding one of said rows of said memory cell array in accordance with a first input address;

column decoders each configured to select a corresponding one of said columns of said memory cell array in accordance with a second input address; and a plurality of storage circuits each configured to store an address assigned to a defective memory cell, and to store mapping information indicative of a relationship with said redundancy units, said storage circuits each outputting a replacement control signal for said defective memory cell on the basis of said mapping information when an address assigned to said defective memory cell stored therein matches an input address, wherein said storage circuits store address information to select one of said sub cell arrays arranged in a row direction.

9. The semiconductor memory device according to claim 8, wherein said storage circuits each include:

an address designating fuse circuit configured to store an address assigned to said defective memory cell;

a mapping fuse circuit configured to store mapping information which indicates said relationship between said redundancy units and said storage circuit, said mapping fuse circuit being stored address information to select one of said sub cell arrays arranged in a row direction;

an address match detecting circuit configured to detect whether the address stored in said address designating fuse circuit matches the input address and to generate an output signal indicating that a match has been detected, thereby creating the replacement control signal; and a decoder configured to decode an output signal of said mapping fuse circuit when said address match detecting circuit has generated the output signal.

10. The semiconductor memory device according to claim 8, further comprising spare decoders for replacing normal decoders, each of said spare decoders being activated by the replacement control signal from a corresponding one of the storage circuits, thereby selecting a corresponding one of the redundancy units.

11. The semiconductor memory device according to claim 10, wherein each of the spare decoders is connected to a corresponding one of the replacement control signal lines, and each of the normal decoders corresponds to said one of the spare decoders and is connected to said corresponding one of the replacement control signal lines via an inverter circuit.

12. The semiconductor memory device according to claim 8, wherein each of the redundancy units is located adjacent to a corresponding one of the sub cell arrays.

13. The semiconductor memory device according to claim 8, wherein each of the storage circuits has a plurality of output terminals for outputting the replacement control signal, the output terminals of each of the storage circuits being connected to each other by a plurality of replacement control signal lines, and consisting of a wire OR circuit.

14. The semiconductor memory device according to claim 8, wherein each of the redundancy units is located adjacent to the sub cell arrays of a corresponding row.

15. The semiconductor memory device according to claim 8, wherein each of the redundancy units is interposed between the sub cell arrays of a corresponding row and a corresponding one of the row decoders.

16. The semiconductor memory device according to claim 8, wherein each of the row decoders is interposed between a corresponding one of the redundancy units and a corresponding one of the sub cell arrays.

17. The semiconductor memory device according to claim 8, wherein each of the redundancy units is located in the middle of the sub cell array of a corresponding row.

18. The semiconductor memory device according to claim 8, wherein the redundancy units are located adjacent to that one of the sub cell arrays which is situated at an end of the memory cell array.

19. The semiconductor memory device according to claim 8, wherein the memory cell array has a first sub cell array of a large capacitance, and a second sub cell array of a smaller capacitance than the first sub cell array, the redundancy units being located adjacent to the first sub cell array, and one of the redundancy units being located adjacent to the second sub cell array.

20. A semiconductor memory device comprising:
    a memory cell array having memory cells arranged in columns and rows, said memory cell array being divided into a plurality of banks;
    a plurality of redundancy units for replacement of defective memory cells in said memory cell array; and
    a plurality of storage circuits each configured to store an address assigned to a defective memory cell, mapping information indicative of a relationship with said redundancy units, first address information to select said banks, and second address information to select all of said plurality of banks regardless of said first address information, said storage circuits each outputting a replacement control signal for said defective memory cell based on said mapping information and said first and second address information, when the address assigned to said defective memory cell stored therein matches an input address.

21. The semiconductor memory device according to claim 20, wherein said storage circuits each include:
    an address designating fuse circuit configured to store the address assigned to said defective memory cell, the first address information and the second address information;
    a mapping fuse circuit configured to store the mapping information which indicates the relationship between said redundancy units and said respective storage circuit;
    an address match detecting circuit configured to detect whether the address stored in said address designating fuse circuit matches the input address and to generate an output signal indicating that a match has been detected; and
    a decoder configured to decode an output signal of said mapping fuse circuit when said address match detecting circuit has generated the output signal, thereby creating the replacement control signal.

22. The semiconductor memory device according to claim 21, wherein said address designating fuse circuit and said mapping fuse circuit each include;
    a first transistor which is coupled to a power supply voltage, said first transistor precharging the output signal of its respective circuit; and
    a second transistor which is arranged between said first transistor and a ground voltage.

23. The semiconductor memory device according to claim 20, further comprising spare decoders for replace normal decoders, each of said spare decoders being activated by the replacement control signal from a corresponding one of the storage circuits, thereby selecting a corresponding one of the redundancy units.

24. The semiconductor memory device according to claim 23, wherein each of the spare decoders is connected to a corresponding one of a plurality of replacement control signal lines, and each of the normal decoders corresponds to said one of the spare decoders and is connected to said corresponding one of the replacement control signal lines via an inverter circuit.

25. The semiconductor memory device according to claim 20, wherein each of the storage circuits has a plurality of output terminals for outputting the replacement control signal, the output terminals of each of the storage circuits being connected to each other by a plurality of replacement control signal lines, and consisting of a wired OR circuit.

26. The semiconductor memory device according to claim 20, wherein the number of storage circuits is smaller than the number of redundancy units.

27. A semiconductor memory device comprising:
    a memory cell array having memory cells arranged in columns and rows, said memory cell array being divided into a plurality of banks;
    a plurality of row select lines configured to select rows of said memory cells;
    a plurality of column select lines configured to select columns of said memory cells, each of said plurality of column select lines being shared by said plurality of banks;
    a plurality of redundancy units for replacement of defective memory cells in said memory cell array; and
    a plurality of storage circuits each configured to store an address to a defective memory cell, mapping information indicative of a relationship with said redundancy units, first address information to select said banks, and second address information to select all of said plurality of banks connected to each of said column select lines regardless of said first address information, said storage circuits each outputting a replacement control signal for said defective memory cell based on said mapping information and said first and second address information, when the address assigned to said defective memory cell stored therein matches an input address.

28. The semiconductor memory device according to claim 27, wherein said storage circuits each include:
    an address designating fuse circuit configured to store the address assigned to said defective memory cell, the first address information and the second address information;
    a mapping fuse circuit configured to store the mapping information which indicates the relationship between said redundancy units and said respective storage circuit;
    an address match detecting circuit configured to detect whether the address stored in said address designating fuse circuit matches the input address and to generate an output signal indicating that a match has been detected; and
    a decoder configured to decode an output signal of said mapping fuse circuit when said address match detecting circuit has generated the output signal, thereby creating the replacement control signal.

29. The semiconductor memory device according to claim 28, wherein said address designating fuse circuit and said mapping fuse circuit each include:
    a first transistor which is coupled to a power supply voltage, said first transistor precharging the output signal of its respective circuit; and
    a second transistor which is arranged between said first transistor and a ground voltage.

30. The semiconductor memory device according to claim 27, further comprising spare decoders for replacing normal decoders, each of said spare decoders being activated by the replacement control signal from a corresponding one of the storage circuits, thereby selecting a corresponding one of the redundancy units.

31. The semiconductor memory device according to claim 30, wherein each of the spare decoders is connected to a corresponding one of a plurality of replacement control signal lines, and each of the normal decoders corresponds to said one of the spare decoders and is connected to said corresponding one of the replacement control signal lines via an inverter circuit.

32. The semiconductor memory device according to claim 27, wherein each of the storage circuits has a plurality of output terminals for outputting the replacement control signal, the output terminals of each of the storage circuit being connected to each other by a plurality of replacement control signal lines, and consisting of a wired OR circuit.

33. The semiconductor memory device according to claim 27, wherein the number of storage circuits is smaller than the number of redundancy units.

* * * * *